US010883176B2

(12) United States Patent
Song et al.

(10) Patent No.: US 10,883,176 B2
(45) Date of Patent: Jan. 5, 2021

(54) METHOD FOR DIRECTLY SYNTHESIZING GRAPHENE ON SURFACE OF TARGET OBJECT AND DEVICE INCLUDING GRAPHENE PREPARED USING THE METHOD

(71) Applicant: KOREA INSTITUTE OF SCIENCE AND TECHNOLOGY, Seoul (KR)

(72) Inventors: Yong-Won Song, Seoul (KR); Md. Siam Uddin, Seoul (KR); Jaehyun Park, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 33 days.

(21) Appl. No.: 16/198,877

(22) Filed: Nov. 23, 2018

(65) Prior Publication Data

US 2019/0345610 A1   Nov. 14, 2019

(30) Foreign Application Priority Data

May 9, 2018  (KR) ........................ 10-2018-0053154

(51) Int. Cl.
*C23C 16/26* (2006.01)
*C23C 18/12* (2006.01)
(Continued)

(52) U.S. Cl.
CPC ........ *C23C 18/1204* (2013.01); *C23C 16/403* (2013.01); *C23C 16/45525* (2013.01);
(Continued)

(58) Field of Classification Search
CPC . C23C 16/45525; C23C 16/26; C23C 16/403; C23C 18/1204; C23C 18/125
See application file for complete search history.

(56) References Cited

U.S. PATENT DOCUMENTS 8,139,617 B2      3/2012  Song
2011/0059599 A1*  3/2011  Ward ............. H01L 29/1606
                                              438/507
(Continued)

FOREIGN PATENT DOCUMENTS

KR   1020110064072 A    6/2011
KR   1020120011921 A    2/2012
(Continued)

OTHER PUBLICATIONS

Park, Jaehyun, et al., "Growth, Quantitative Growth Analysis, and Applications of Graphene on γ-Al2O3 catalysts". Scientific Reports | 5:11839 |, pp. 1-12. DOI: 10.1038/srep11839.*
(Continued)

*Primary Examiner* — Bret P Chen
(74) *Attorney, Agent, or Firm* — Cantor Colburn LLP

(57) ABSTRACT

A method for directly synthesizing graphene on a surface of a target object includes: forming a non-metal layer on a support substrate; disposing the target object in a space above the support substrate, which is opposite to the non-metal layer; and injecting a carbon precursor to form graphene on the surface of the target object to synthesize a graphene film, wherein the graphene is nucleated and grown by a decomposition of the carbon precursor, the carbon precursor is decomposed by heat with catalytic assistance from the non-metal layer, and a carbon atom from the decomposition of the precursor is anchored on the surface to form the graphene film.

17 Claims, 16 Drawing Sheets

(51) Int. Cl.
| | | |
|---|---|---|
| *H01L 21/02* | (2006.01) | |
| *H01S 3/067* | (2006.01) | |
| *H01S 3/113* | (2006.01) | |
| *H01S 3/10* | (2006.01) | |
| *H01S 3/23* | (2006.01) | |
| *C23C 16/455* | (2006.01) | |
| *C23C 16/40* | (2006.01) | |
| *H01S 3/0941* | (2006.01) | |
| *H01L 29/16* | (2006.01) | |
| *H01L 29/786* | (2006.01) | |
| *H01S 3/094* | (2006.01) | |

(52) U.S. Cl.
CPC ........ *C23C 18/125* (2013.01); *H01L 21/0243* (2013.01); *H01L 21/0262* (2013.01); *H01L 21/02527* (2013.01); *H01S 3/06716* (2013.01); *H01S 3/06754* (2013.01); *H01S 3/10061* (2013.01); *H01S 3/113* (2013.01); *H01S 3/23* (2013.01); *H01L 29/1606* (2013.01); *H01L 29/78684* (2013.01); *H01S 3/0941* (2013.01); *H01S 3/094003* (2013.01)

(56) References Cited

U.S. PATENT DOCUMENTS

| | | | | |
|---|---|---|---|---|
| 2012/0025413 | A1 | 2/2012 | Cho et al. | |
| 2012/0265122 | A1 | 10/2012 | El-Shall et al. | |
| 2013/0121362 | A1 | 5/2013 | Kub et al. | |
| 2013/0309458 | A1* | 11/2013 | Moon | H01L 21/187 428/195.1 |
| 2014/0174927 | A1* | 6/2014 | Bashir | C12Q 1/6827 204/452 |
| 2014/0199550 | A1* | 7/2014 | Helvajian | C23C 16/4415 428/412 |
| 2015/0098891 | A1* | 4/2015 | Song | C01B 32/186 423/448 |
| 2015/0206748 | A1* | 7/2015 | Sumant | H01L 21/02444 438/481 |
| 2015/0306550 | A1* | 10/2015 | Lee | B01D 67/0062 210/500.21 |
| 2016/0064489 | A1* | 3/2016 | Zhang | H01L 21/0259 257/26 |
| 2016/0351886 | A1* | 12/2016 | Braun | H01M 4/38 |
| 2016/0365585 | A1* | 12/2016 | Kamepalli | C23C 16/50 |
| 2017/0009371 | A1* | 1/2017 | Hwang | C30B 29/02 |
| 2017/0160503 | A1* | 6/2017 | Gao | G02B 6/4492 |
| 2017/0346010 | A1* | 11/2017 | Chen | H01L 51/0048 |
| 2018/0240887 | A1* | 8/2018 | Koenig | H01L 29/1083 |

FOREIGN PATENT DOCUMENTS

| | | | |
|---|---|---|---|
| KR | 101298084 B1 | 8/2013 | |
| KR | 101350263 B1 | 1/2014 | |
| KR | 1020150040606 A | 4/2015 | |
| KR | 101548424 B1 | 8/2015 | |
| KR | 1020160124832 A | 10/2016 | |
| WO | 2015126747 A1 | 8/2015 | |
| WO | WO 2016/156659 * | 10/2016 | ........... C23C 16/455 |

OTHER PUBLICATIONS

Dang, Thanh Truong, et al., "Clean and effective catalytic reduction of graphene oxide using atomic hydrogen spillover on Pt/g—Al2O3 catalyst". Materials Letters 86 (2012) pp. 161-164.*

Lee, Minsoo, et al., "Oxygen-Dependent Synthesis of Graphene on γ-Alumina Catalyst". Advanced Materials Interfaces, 2017, 4, 1700603, pp. 1-6.*

Barin, Gabriela B., et al., "Pre-Patterned CVD Graphene: Insights on ALD deposition parameters and their influence on Al2O3 and graphene layers". MRS Advances, 2016, pp. 1401-1409.*

Zhang, Yijun, et al., "Low-temperature remote plasma-enhanced atomic layer deposition of graphene and characterization of its atomic-level structure.". Journal of Materials Chemistry C, 2014, 2, 7570-7574.*

J. B. Park et al., "Fast growth of graphene patterns by laser direct writing", Applied Physics Letters, 2011, 3 pages, vol. 98, No. 123109, American Institute of Physics.

Jinsung Kwak et al., "Near room-temperature synthesis of transfer-free graphene films", Nature Communications, Jan. 24, 2012, pp. 1-7, vol. 3, No. 645, Macmillan Publishers Limited.

Zhipei Sun et al., "Graphene Mode-Locked Ultrafast Laser", ACS Nano, Jan. 25, 2010, pp. 803-810, vol. 4, No. 2, American Chemical Society.

Jaehyun Park et al., "Growth, Quantitative Growth Analysis, and Applications of Graphene on gamma-Al2O3 catalysts," Scientific Reports, Jul. 3, 2015, pp. 1-12, vol. 5, No. 11839.

Jinbo Pang et al., "Self-Terminating Confinement Approach for Large-Area Uniform Monolayer Graphene Directly over Si/SiOx by Chemical Vapor Deposition," ACS Nano, Jan. 24, 2017, pp. 1946-1956, vol. 11, American Chemical Society.

Korean Notice of Allowance for KR Application No. 10-2018-0053154 dated Feb. 18, 2020.

* cited by examiner

METHOD FOR DIRECTLY SYNTHESIZING GRAPHENE ON SURFACE OF TARGET OBJECT AND DEVICE INCLUDING GRAPHENE PREPARED USING THE METHOD

CROSS-REFERENCE TO RELATED APPLICATION

This application claims priority to Korean Patent Application No. 10-2018-0053154, filed on May 9, 2018, and all the benefits accruing therefrom under 35 U.S.C. § 119, the contents of which in its entirety are herein incorporated by reference.

BACKGROUND

1. Field

The present disclosure relates to a method for directly synthesizing graphene on a surface of a target object, and an electronic device or an optical device including graphene prepared using the method. More particularly, the present disclosure relates to a technique of directly synthesizing graphene on a customized surface including not only a simple planar shape but also a three-dimensional shape through an etching-free and transfer-free process.

[Description about National Research and Development Support]

This study was supported by the individual basic research of Ministry of Science and ICT, Republic of Korea (Research for ultrahigh speed photonics device based on block phosphor, Project No. 1711052009) under the superintendence of Korea Institute of Science and technology.

2. Description of the Related Art

Graphene is gaining popularity in the electronic and optical fields due to properties such as linear dispersion of dirac-fermion, ultrafast recovery time, wavelength-independent saturation absorption, and very high optical non-linearity.

In the existing technique, a metal catalyst is used to synthesize graphene on the surface of the metal catalyst. For example, if graphene is required on a substrate (or, a device), a transferring process is used to apply graphene synthesized on the surface of a separate metal catalyst to a substrate. The transfer is a process of moving graphene grown on a specific substrate to the surface of a target optical device. After the graphene is synthesized on the surface of the metal catalyst, etching is performed to remove the metal catalyst and remain only the graphene, and the graphene is moved to a desired substrate by the transferring process, thereby applying the synthesized graphene to the substrate.

However, in the transferring process (for example, by etching), the structure of graphene is not able to avoid physical and chemical damages, resulting in degradation of quality. In addition, since the transferring process is further performed after the synthesizing process, resources such as time and energy are consumed more and the process becomes complicated.

Further, when graphene is transferred to a device that has recently been scaled down and integrated, it is very difficult to selectively transfer the graphene only to a necessary spot.

In order to solve this problem, as shown in FIG. 1, there is an attempt to synthesize graphene at an interface between a metal catalyst and a substrate to which the graphene is to be applied. In this technique, a desired pattern of metal is formed on a desired substrate so that graphene does not need to be transferred after being synthesized, and then graphene is synthesized at the interface between the metal and the substrate, and the metal is removed by etching. The technique allows graphene to be coated on a desired substrate without a transfer process. However, the technique also requires a liquid phase process, called etching, and it is inevitably impossible to avoid the degradation of quality of the graphene due to etching. In addition, in the existing technique, only a planar graphene of a two-dimensional structure may be synthesized, and thus there is a limit in applying a synthesized graphene to an integrated device having a three-dimensional surface.

RELATED LITERATURES

Patent Literature

Korean Patent Registration No. 10-1350263

SUMMARY

The present disclosure is directed to providing a method for directly synthesizing graphene on a surface of a target object having not only a simple plane but also a customized surface.

In addition, the present disclosure is directed to providing a device including graphene prepared using the method, and apparatuses including the device.

In one aspect, there is provided a method for directly synthesizing graphene on a surface of a target object, comprising: forming a non-metal layer on a support substrate; disposing the target object in a space above the support substrate, which is opposite to the non-metal layer; and injecting a carbon precursor to form graphene on the surface of the target object to synthesize a graphene film, wherein the graphene is nucleated and grown by a decomposition of the carbon precursor, the carbon precursor is decomposed by heat with catalytic assistance from the non-metal layer, a carbon atom from the decomposition of the precursor is anchored on the surface to form the graphene film.

In an embodiment, the carbon atom is supplied to surface of the target object by means of dissociative adsorption to nucleate and grow the graphene, an energy of metastable atom of the non-metal layer is supplied to the carbon precursor for the decomposition of the carbon precursor to generate the carbon atom.

In an embodiment, at least a part of the surface of the target object may have a three-dimensional shape.

In an embodiment, the disposing the target object may include that the non-metal layer and the target object are at least partially not in contact with each other.

In an embodiment, a non-contact interval between the target object and the non-metal layer may be 1 nm to 2000 um.

In an embodiment, the support substrate may have a groove having a V-shaped form or may have a constant interval between the support substrate and the target object.

In an embodiment, the method may further comprise installing a screen to block at least a part of an ambient space of the target object.

In an embodiment, the non-metal layer may be made of gamma (γ) alumina.

In an embodiment, the forming a non-metal layer may include forming an amorphous non-metal layer by using atom layer deposition (ALD).

In an embodiment, the forming a non-metal layer may further include crystallizing the amorphous non-metal layer.

In an embodiment, the precursor for forming the non-metal layer may include any one aluminum precursor selected from the group consisting of trimethyl aluminum ($(CH_3)_3Al$, TMA), aluminum isopropoxide($[Al(OC_3H_7)_3]$, IPA), methyl pyrrolidine-tri-methyl aluminum (MPTMA), ethyl-pyridine-triethyl-aluminum (EPPTEA), ethyl-pyridine-dimethyl-aluminum hydride (EPPDMAH), trimethyl aluminum ($AlCH_3$), and combinations thereof.

In an embodiment, the method may further comprise synthesizing another graphene on a surface of another target object by reusing the non-metal layer formed on the support substrate.

In an embodiment, the carbon precursor may include any one selected from the group consisting of methane, ethane, propane, acetylene, methanol, ethanol, propanol, and combinations thereof.

In an embodiment, the reaction gas may include any one selected from the group consisting of nitrogen, helium, neon, argon, hydrogen, and combinations thereof.

In an embodiment, the target object may be an optical fiber, and a surface of the optical fiber may be at least partially removed.

In an embodiment, when the graphene is synthesized, conductivity or semi-conductivity may be determined according to a distance between the non-metal layer and the target object surface, and the conductive graphene may be synthesized when the non-metal layer is formed in contact with the surface of the target object, and the semi-conductive graphene may be synthesized when the non-metal layer is formed not in contact with (for example, separated from) the surface of the target object.

In another aspect of the present disclosure, there is also provided a laser pulse device, which uses a graphene film synthesized according to the above embodiments as a saturable absorber, wherein the laser pulse device may include at least one of a light source, a coupler, an amplifier, an isolator, a polarization controller (PC), and a single-mode fiber (SMF).

In another aspect of the present disclosure, there is also provided an optical switch device, which uses a graphene film synthesized according to the above embodiments as a saturable absorber, wherein the optical switch device may include at least one of a first channel and a second channel configured to generate different continuous wave lasers, a modulator configured to modulate the lasers, a tunable filter configured to reduce an ambient noise while matching a central wavelength with the lasers, an amplifier configured to amplify intensities of the lasers, respectively, and a polarization controller (PC) configured to control polarization of the lasers.

In another aspect of the present disclosure, there is also provided a thin film transistor, which includes a graphene film synthesized according to the above embodiments. In addition, the thin film transistor includes: a dielectric layer, as the dielectric layer is the target object; a non-metal layer located on one surface of the dielectric layer; a gate electrode located on an opposite surface of the dielectric layer; a first graphene film having the conductive graphene; and a second graphene film having the semi-conductive graphene. Here, the dielectric layer is at least partially not in contact with the non-metal layer, and the second graphene film is located at a non-contact portion.

In a method of for directly synthesizing graphene on a surface of a target object according to an embodiment of the present disclosure, graphene is directly synthesized on a surface of a target object through a transfer-free process which does not use a transferring process for transferring a graphene film to a target object (for example, a target board), after the graphene film is synthesized on a separate substrate.

In addition, graphene may be synthesized on the surface through a metal-free process that does not use a metal catalyst such as nickel or copper. Thus, a process for removing the metal catalyst such as etching is not performed.

Since the graphene film is synthesized through a transfer-free and metal-free process, there is no degradation of graphene quality (e.g., additional defects, wrinkles, tears, and the like) after synthesis, which may occur in the graphene film during the transferring and etching processes, so it is possible to provide a high-quality graphene giving excellent electrical and optical characteristics.

In particular, since the surface of the target object is not limited to a simple two-dimensional plane, it is possible to synthesize a graphene film even on a stereoscopic surface with a three-dimensional structure. Thus, the present disclosure may be utilized to fabricate a future integrated device that may have increasingly complex structures and have various surface structures according to the designer's intent.

In addition, the semi-conductivity and conductivity of graphene may be controlled depending on a distance between the surface of a non-metal layer serving as a catalyst and the surface of the target substrate.

The effects of the present disclosure are not limited to the effects mentioned above, and other effects not mentioned may be clearly understood by those skilled in the art from the description of the claims.

BRIEF DESCRIPTION OF THE DRAWINGS

In order to more clearly describe the present disclosure or the technical solution to the conventional techniques, the drawings necessary to describe the embodiments will be briefly introduced below. It should be understood that the following drawings are for purposes of illustrating the embodiments of the present disclosure and are not intended to limit the same. In addition, for clarity of description, some elements to which various modifications such as exaggeration, omission or the like are applied may be shown in the following drawings.

Figure 6:
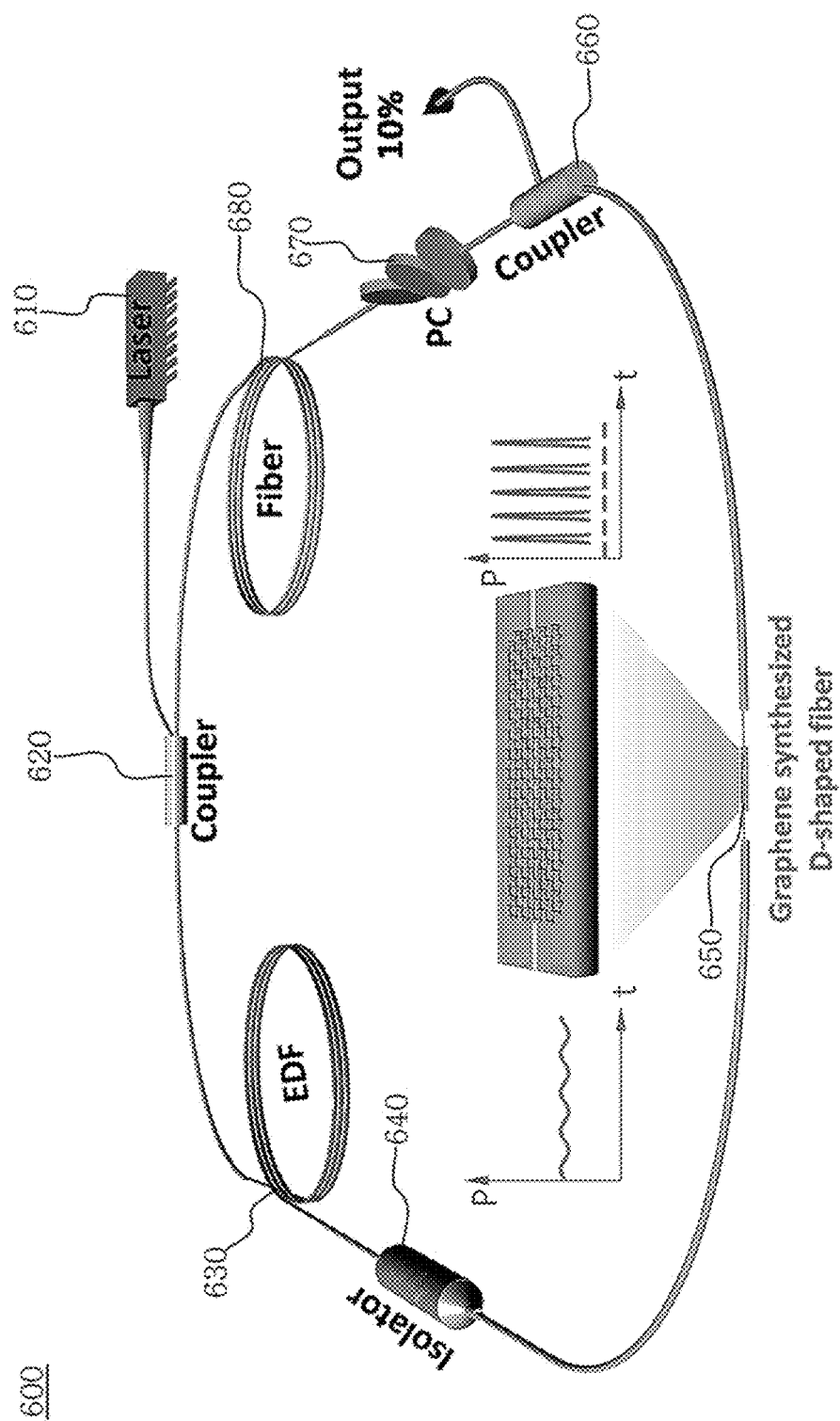
FIG. 6 is a schematic diagram showing a laser pulse device including a bare fiber where the graphene of FIG. 2 is directly synthesized to the surface according to an embodiment of the present disclosure.

FIGS. 7A to 7D are diagrams showing characteristics of pulse generated by the laser pulse device of FIG. 6 according to an embodiment of the present disclosure.

Figure 1:
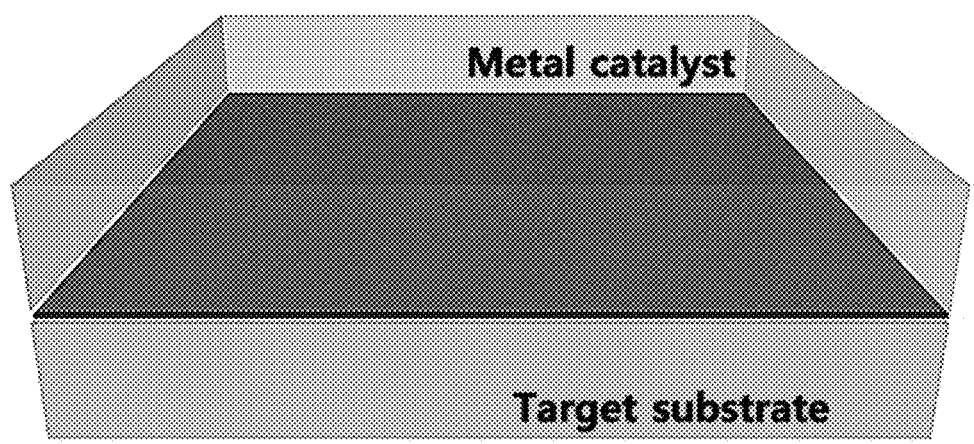
FIG. 1 is a diagram for illustrating a process of synthesizing graphene using a metal according to a conventional technique.
Figure 2:
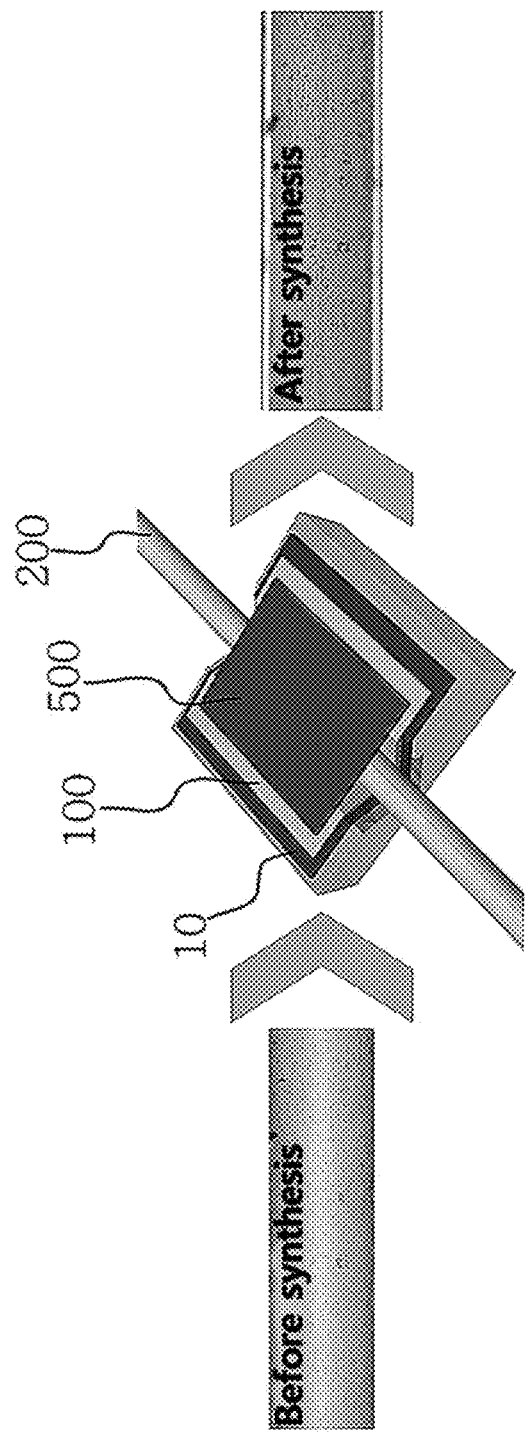
FIG. 2 is a diagram showing a result obtained by directly synthesizing graphene on a surface of a target object according to an embodiment of the present disclosure.
Figure 8:
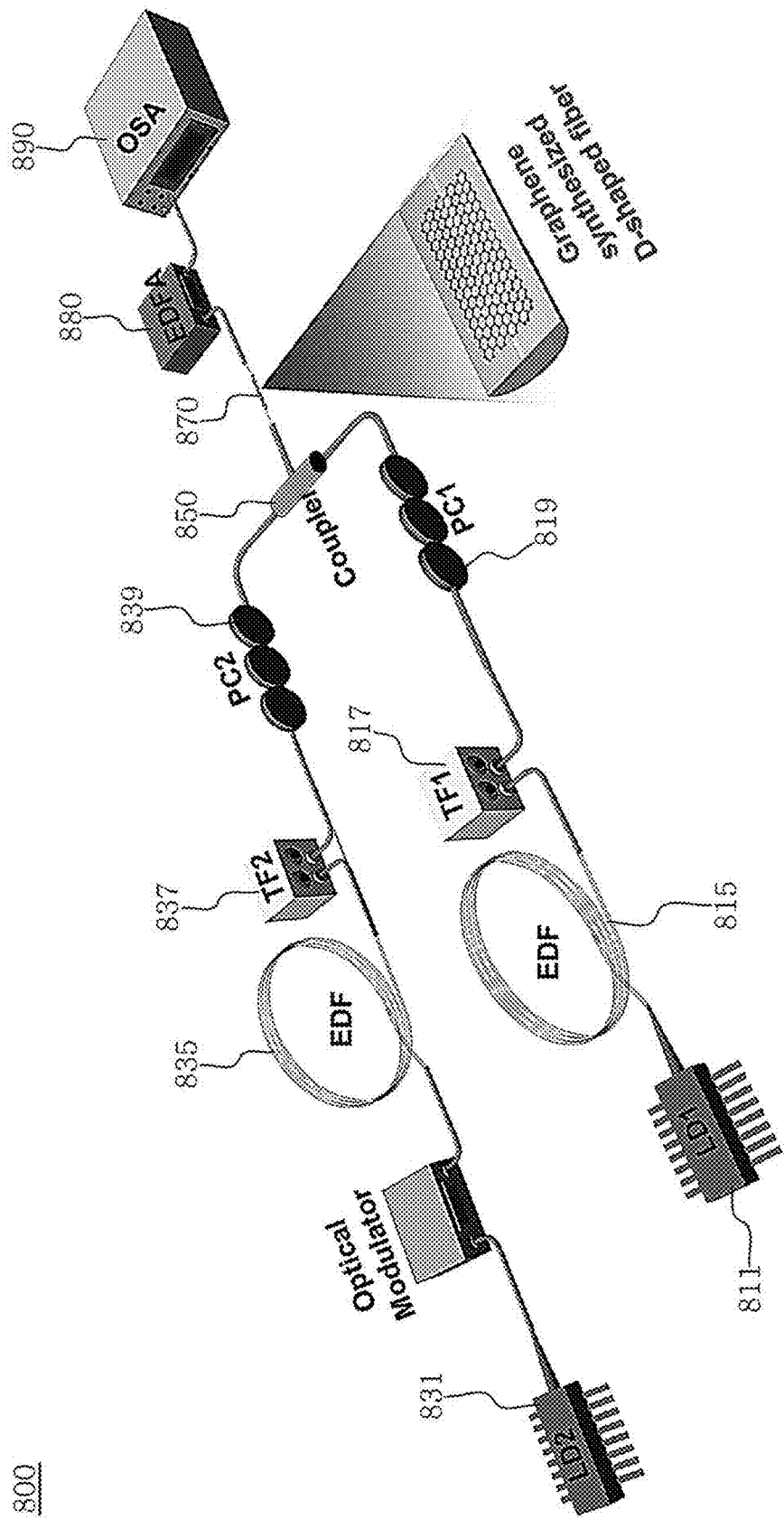

FIG. 8 is a schematic diagram showing an optical switch device including a bare fiber where the graphene of FIG. 2 is directly synthesized to the surface according to an embodiment of the present disclosure.

Figure 9A:
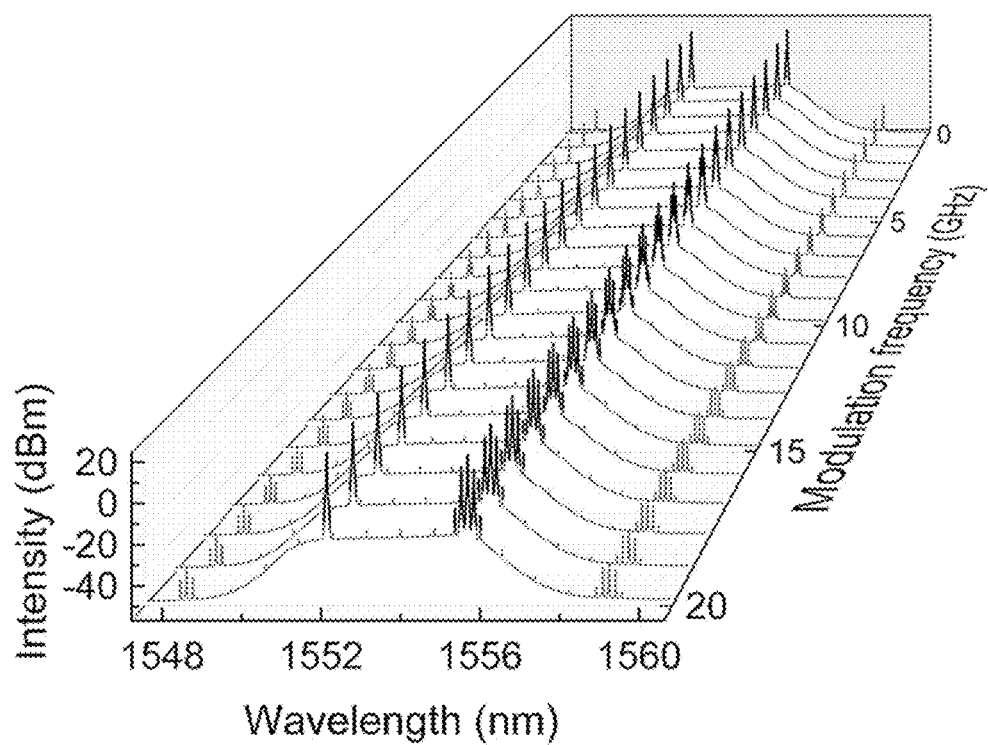
Figure 9B:
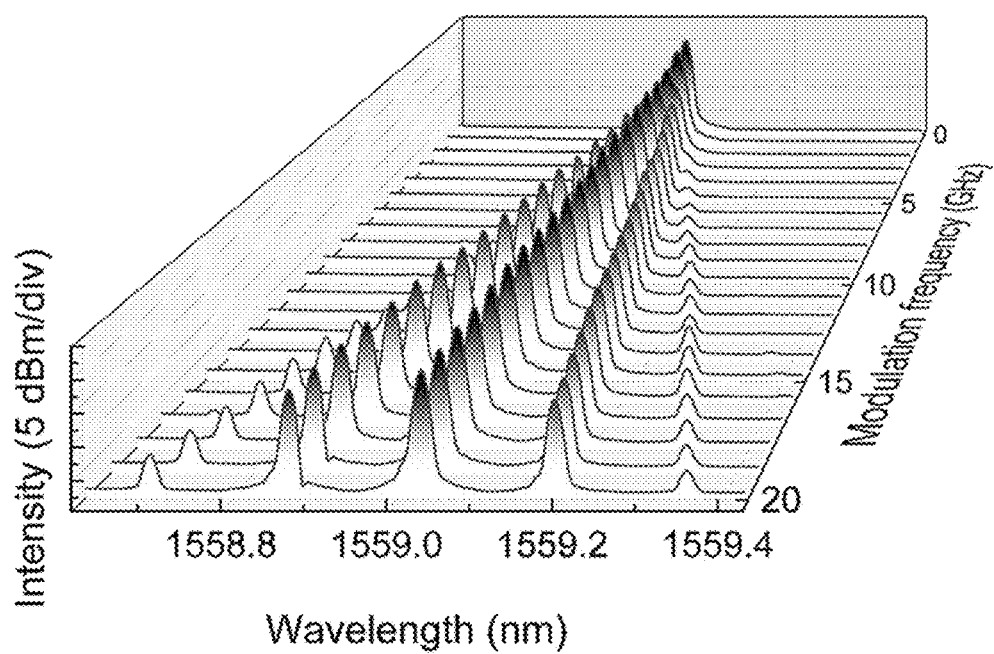

FIGS. 9A and 9B are diagrams showing spectrum results of a signal modulated at the optical switch device of FIG. 8 according to an embodiment of the present disclosure.

Figure 10A:
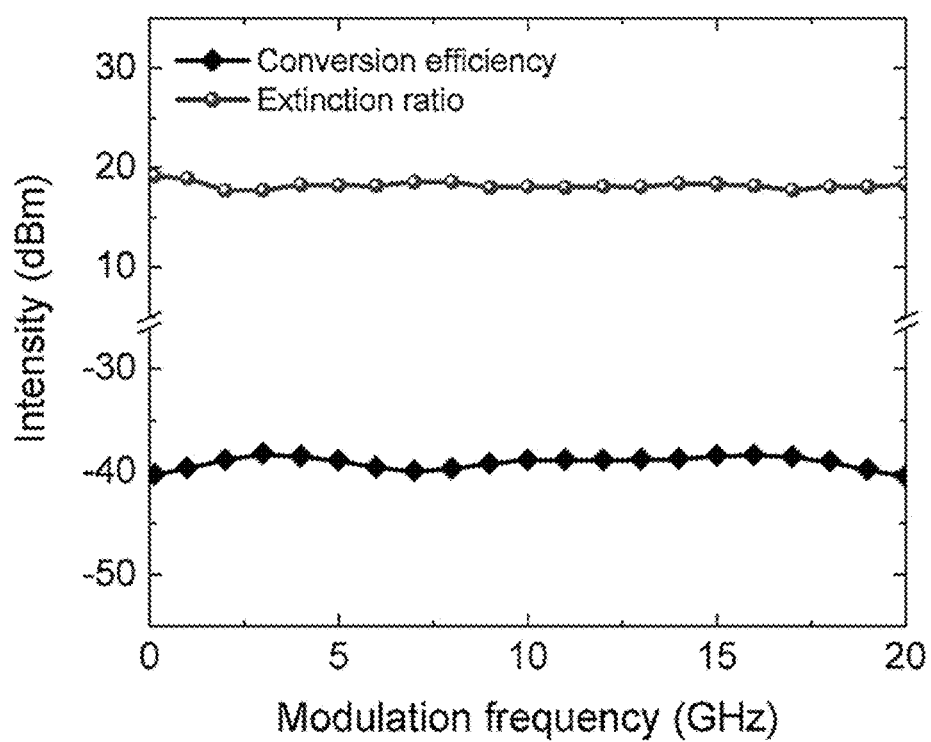
Figure 10B:
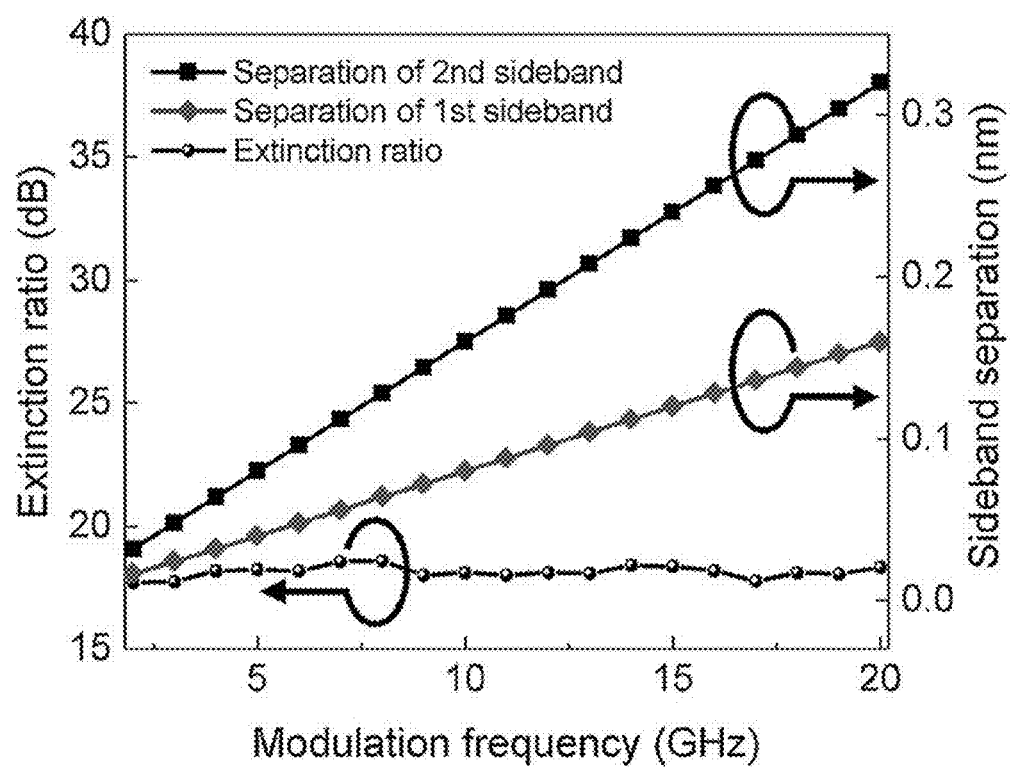

FIGS. 10A to 10B are diagrams showing characteristics of the signal generated in FIG. 8 according to an embodiment of the present disclosure.

Figure 11:
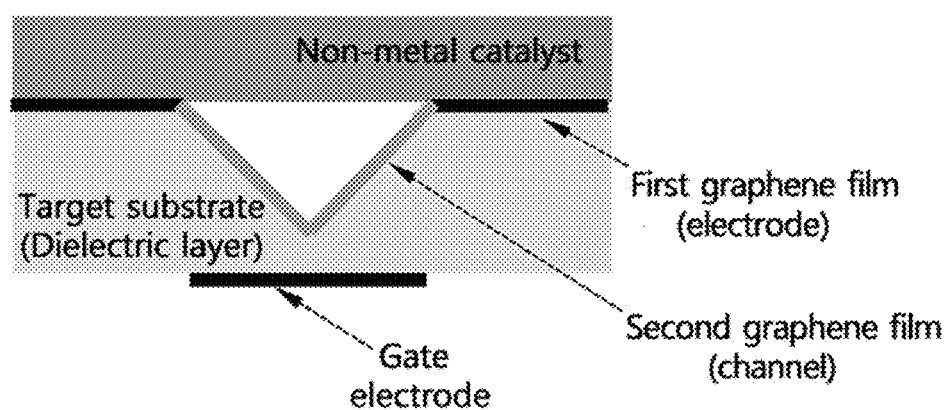

FIG. 11 is a diagram showing a conceptual structure of a graphene thin film transistor according to an embodiment of the present disclosure.

DETAILED DESCRIPTION

The terms in the present disclosure are used only to illustrate definitive embodiments and are not intended to limit the present disclosure. The singular expression as used in the present disclosure and the appended claims is intended to include a plural expression, unless the context clearly dictates otherwise. In addition, it should be understood that the term "and/or" used in the present disclosure includes any one item, or any possible combination of a plurality of listed items.

When it is cited that any component is at an "upper portion" of another component, the component may be directly on the top of another portion, or any other component may be interposed therebetween. In contrast, when it is cited that any component is directly at an "upper portion" of another component, any other component is not interposed therebetween.

The terms "first", "second", "third" and the like are used to describe various portions, components, regions, layers, and/or sections, but are not limited thereto. These terms are only used to distinguish any portion, component, region, layer or section from another portion, component, region, layer or section. Accordingly, a first portion, component, region, layer or section described below may also be referred to as a second portion, component, region, layer or section without departing from the scope of the present disclosure.

The terminology used herein is for the purpose of describing particular embodiments only and is not intended to limit the present disclosure. The singular forms used herein include plural forms as well, provided that the phrases do not expressly have the opposite meaning. The meaning of the term "include" used in the specification is to specify a particular feature, region, integer, step, operation, element and/or component and is not to exclude the presence or addition of other features, regions, integers, steps, operations, elements, and/or components.

Unless otherwise defined, all terms including technical and scientific terms used herein have the same meaning as commonly understood by those skilled in the art. The terms defined in the dictionaries commonly used in the art are further interpreted as having meanings consistent with the relevant technical literature and the present disclosure, and are not to be construed as ideal or very formal meanings unless defined otherwise.

Hereinafter, embodiments of the present disclosure will be described in detail with reference to the drawings.

FIG. 2 is a diagram showing a result obtained by directly synthesizing graphene on a surface of a target object according to an embodiment of the present disclosure.

In this specification, the terms such as "upper", "lower" and the like represent relative positional relationships and do not represent absolute positional relationships (based on gravity or coordinates, for example) depending on the point of view of an observer. For example, in the embodiment of FIG. 2, a component 100 may be illustrated as being formed and positioned on a component 10, but in the embodiment of FIG. 3, the components are located opposite to the embodiment of FIG. 2 (for example, the component 100 may be located below the component 10).

In a method for directly synthesizing graphene on a surface of a target object according to an embodiment of the present disclosure, as shown in FIG. 2, an optical fiber having a three-dimensional surface (for example, with a circular section) and also having a simple planar surface by polishing is used as a target object, and graphene may be directly synthesized on the surface of the optical fiber.

Figure 3:
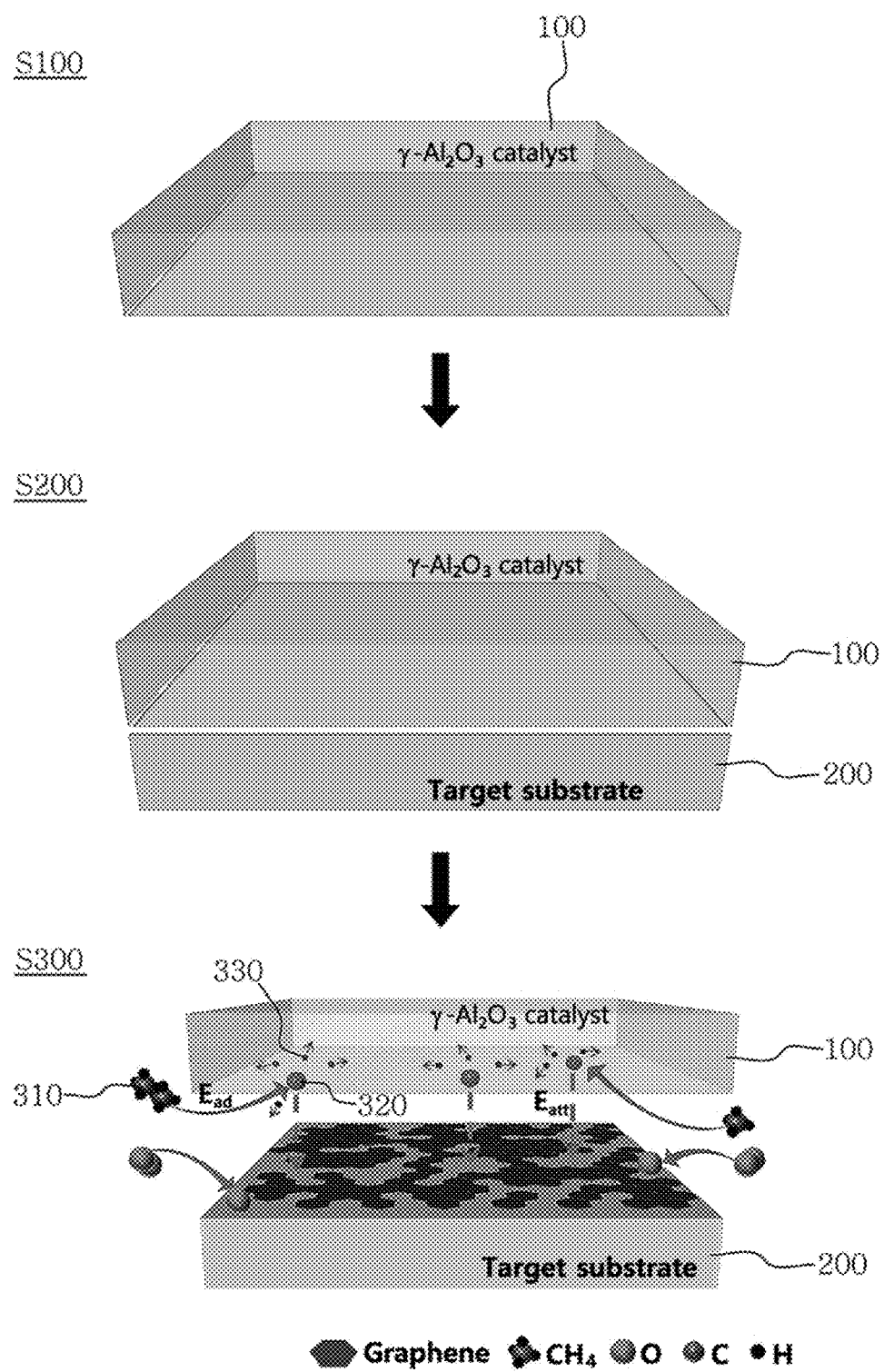
FIG. 3 is a diagram for illustrating a method for synthesizing graphene on a surface of a target object according to an embodiment of the present disclosure.

FIG. 3 is a diagram for illustrating a method for synthesizing graphene on a surface of a target object according to an embodiment of the present disclosure. FIG. 3 is intended to illustrate the method for synthesizing graphene according to an embodiment of the present disclosure, but each step is not limited to the form shown in FIG. 3. For clarity of illustration, the surface of the target object is shown as a plane, and a support substrate 10 is not shown in FIG. 3.

Referring to FIG. 3, the method of directly synthesizing graphene on a surface of a target object according to an embodiment includes forming a non-metal layer 100 (S100), disposing a target object having a target surface (for example, a target board), at which graphene is to be synthesized, in a space opposite to the non-metal layer 100 (S200), and synthesizing a graphene film by growing the graphene on the target surface (S300). In an embodiment, the method may further include installing a screen for blocking at least a part of ambient air around the target object (S500).

In S100 of this embodiment, the non-metal layer 100 may be formed on the support substrate 10. The support substrate 10 is a substrate supporting the non-metal layer 100 and is a substrate separate from the target object such as a target board. In some embodiments, S 100 may include preparing the support substrate 10 in a reactor.

The support substrate 10 may have various shapes. Since the shape of the support substrate 10 is closely related to the quality of graphene to be synthesized, the shape of the support substrate 10 will be described in more detail with reference to FIGS. 4 and 5.

In S100, the non-metal layer 100 is formed on the support substrate 10 inside the reactor. The non-metal layer 100 is supplied with a carbon precursor 310 containing a carbon atom 320 and decomposes the carbon precursor 310 to produce a carbon atom 320 that is used for synthesizing graphene.

In an embodiment, the non-metal layer 100 is made of alumina and may function as an alumina catalyst when being phase-changed. In addition, the non-metal layer 100 includes an oxide such as alumina oxide ($Al_2O_3$). Meanwhile, the non-metal layer 100 does not include a metal catalyst (for example, nickel, copper, etc.) that is generally used to grow graphene.

In an embodiment, the non-metal layer 100 of S100 may be formed by growing at a growth temperature lower than a predetermined temperature (for example, 300° C.) by using atomic layer deposition (ALD). Alternatively, it is also possible to use a non-metal layer 100 that is already prepared. When the non-metal layer 100 already prepared or the non-metal layer 100 grown is applied, a process of crystallizing the non-metal layer 100 may be performed additionally to use the non-metal layer 100 as a catalyst if the non-metal layer 100 is amorphous or non-crystalline. By this crystallization process, it is possible to form a non-metal layer 100 having activity as a catalyst for growing graphene. The crystallization process may be performed separately from S100 to S300, or may be performed to be included in S100 to S300, for example to be performed by the temperature rise in S300.

The non-metal layer 100 may have a metastable atom with an excellent function as a catalyst. In addition, the non-metal layer 100 formed on the support substrate 10 may have a phase that exhibits catalytic activity, which allows better growth of higher-quality graphene. In an embodiment, the non-metal layer 100 may be made of gamma (γ) alumina. The non-metal layer 100 made of gamma (γ) alumina has an $Al_{III}$ site, which is excellent in catalytic properties, and may serve as a catalyst excellent for synthesizing graphene.

The precursor for the growth of the non-metal layer 100 may include any one aluminum precursor selected from the group consisting of trimethyl aluminum (($CH_3$)$_3$Al, TMA), aluminum isopropoxide ([Al($OC_3H_7$)$_3$], IPA), methyl pyrrolidine-tri-methyl aluminum (MPTMA), ethyl-pyridine-tri-ethyl-aluminum (EPPTEA), ethyl-pyridine-dimethyl-aluminum hydride (EPPDMAH), trimethyl aluminum (Al$CH_3$), and combinations thereof.

In S200, a target object 200 such as a target board is disposed in a space, which is opposite to one of the surfaces of the non-metal layer 100 where the support substrate 10 is not present. In an embodiment, the target object 200 may be located below the non-metal layer 100. The target object 200 may be disposed not in contact with a part or the entirety of the non-metal layer 100 to form an interface at various intervals. The interval between the target object 200 and the non-metal layer 100 will be described in more detail with reference to FIGS. 4 and 5.

The step S300 includes injecting the carbon precursor 310 into a reactor to grow graphene on the surface of the target object 200. The graphene is grown by a carbon atom decomposed in the carbon precursor 310. The S300 may be performed by means of chemical vapor deposition (CVD). The carbon precursor 310 may be supplied by injecting a reaction gas containing the carbon precursor 310 into the reactor.

The carbon source 310 is a precursor for synthesizing graphene and may be made of various materials capable of growing graphene on the target object 200 by CVD. In an embodiment, the carbon precursor 310 may be methane. In another embodiment, the carbon precursor 310 may be any one selected from the group consisting of methane, ethane, propane, acetylene, methanol, ethanol, propanol, and combinations thereof.

The reaction gas may include an ambient gas together with the carbon precursor 310. In an embodiment, the ambient gas may be an inert gas. In an example, the inert gas may be argon. In another example, the inert gas may be any one selected from the group consisting of nitrogen, helium, neon, argon, hydrogen, and combinations thereof.

In S300, the non-metal layer 100 may grow graphene on the surface of the target object 200 without a separate metal catalyst (metal-free graphene synthesis).

In an embodiment, the carbon precursor 310 injected into the reactor is decomposed by heat with catalytic assistance from the non-metal layer 100, and the carbon atom 320 from the decomposition is anchored on the surface to form the graphene film. The nucleation and growth of graphene crystals are accomplished by the anchoring of the carbon atom 320. Here, the decomposition by heat with catalytic assistance from the non-metal layer 100 is performed by dissociative adsorption as the surface energy of the metastable atom of the non-metal layer 100 is supplied to the carbon precursor 310.

For example, as shown in FIG. 3, if the carbon precursor 310 is methane ($CH_4$), the hydrogen atom 330 should be separated from the carbon atom 320 in order for the carbon atom 320 to be generated. In order for the hydrogen atom 330 to be separated from the carbon atom 320, energy above a certain energy level is required. Here, the gamma (γ) alumina of the non-metal layer 100 acts as a catalyst to help the generation of the carbon atom 320.

The non-metal layer 100 made of gamma (γ) alumina has a surface containing metastable atoms, unlike aluminum having a smooth surface by having relatively stable atoms. The metastable atoms have dangling bonds with extra energy. Hence, the non-metal layer 100 may have the extra energy, provided due to the dangling bonds of many metastable atoms present on the surface, as surface energy.

As shown in S300 of FIG. 3, if methane 310 is supplied to the gamma (γ) alumina, the methane 310 may be anchored to the surface of the non-metal layer 100 made of gamma (γ) alumina. The methane 310 may be separated into a carbon atom 320 and a hydrogen atom 330 more easily by receiving the surface energy from the anchored surface. The carbon atom 320 and the hydrogen atom 330 may be separated more smoothly at the $Al_{III}$ site.

After that, the non-metal layer 100 diffuses the carbon atoms 320 into the ambient space. If the target object 200 is located at a distance capable of receiving the carbon atom 320, the carbon atom 320 is anchored to the target object 200, and the nucleation of graphene is formed to grow the graphene.

The target object 200 may grow the graphene without being limited to the shape of the target object 200 if the target object 200 is located at a distance capable of receiving the carbon atom 320.

Figure 4:
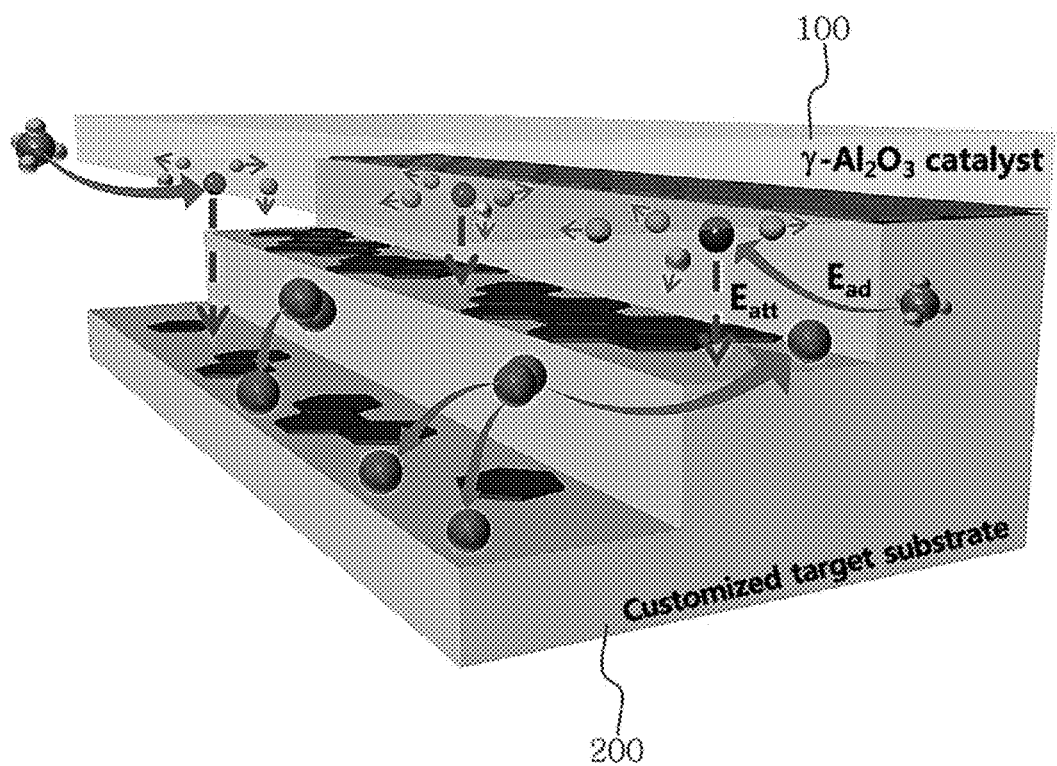
FIG. 4 is a diagram for illustrating the principle of the method for synthesizing graphene on a surface of a target board having a customized surface according to another embodiment of the present disclosure.

FIG. 4 is a diagram for illustrating the principle of the method for synthesizing graphene on a surface of a target board having a customized surface according to another embodiment of the present disclosure.

Here, the three-dimensional surface indicates that the entire surface is not a two-dimensional plane but a part or all of the surface has different heights. Thus, even in the three-dimensional surface, some portions may have two-dimensional planes. For this reason, whether or not a surface is a three-dimensional surface is determined based on the entirety thereof.

Three-dimensional surface includes various types of customized surfaces. For example, the three-dimensional surface may have include concave or convex portions based on its height. In addition, the cross-sectional shape of the surface may have straight lines or curved lines. Further, the three-dimensional surface may include a plurality of regions having one or more shapes.

The graphene may grow not only on the target object 200 having a simple plane as shown in FIG. 3 but also on the target object 200 having a three-dimensional customized surface as shown in FIG. 4.

Figure 5:
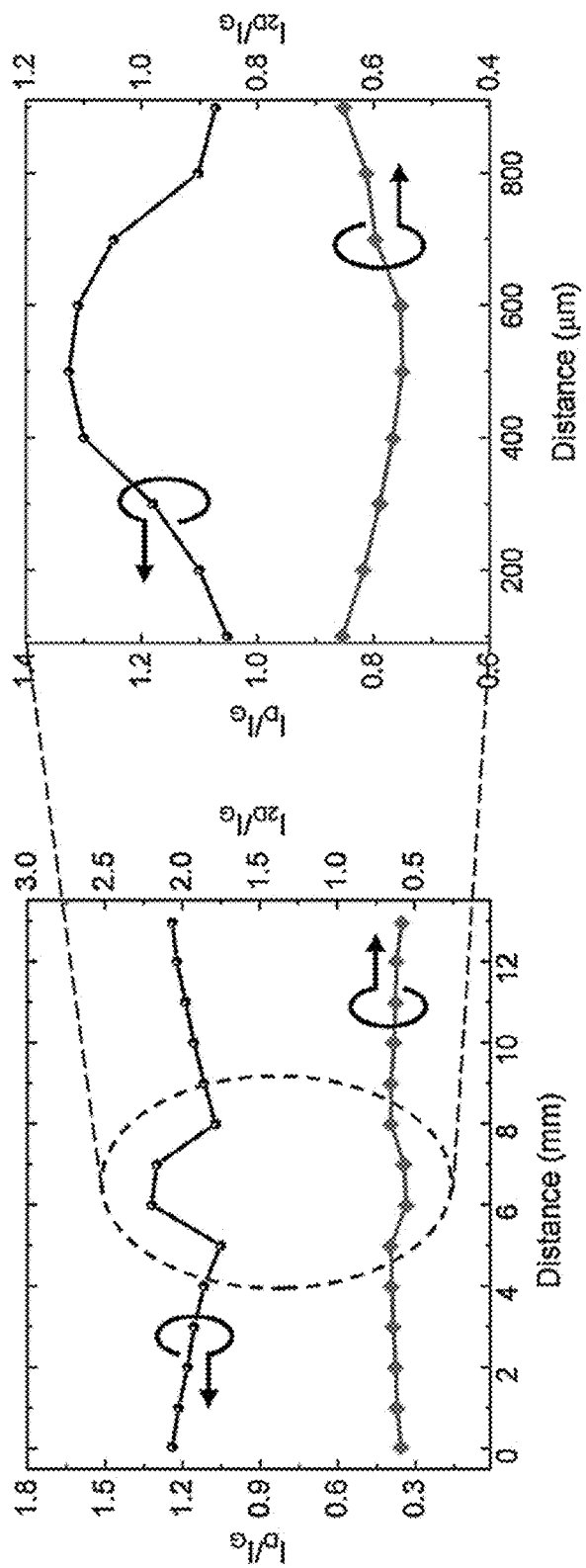
FIG. 5 is a diagram showing the influence applied to the quality of graphene by an interval between a target board and a non-metal layer according to an embodiment of the present disclosure.

FIG. 5 is a diagram showing the influence applied to the quality of graphene by an interval between a target board and a non-metal layer according to an embodiment of the present disclosure.

The quality of the graphene synthesized on the target object 200 is determined by the interval between the target object 200 and the non-metal layer 100. Referring to FIG. 5, the intensity ratio ($I_D/I_G$) of a D peak and a G peak indicating the degree of lattice crystallinity of the graphene is very low when the non-contact interval is between 1 nm and 2000 um, and this result indicates that a high-quality graphene film may be synthesized.

Thus, the form of the support substrate 10 supporting the non-metal layer 100 may be determined based on the measurement result according to the interval of FIG. 5.

In an embodiment, the support substrate 10 supporting the non-metal layer 100 may have a form to reduce the influence caused by the distance from the target object 200. In an embodiment, the support substrate 10 may have a form that allows the non-contact interval with the target object 200 to be between 1 nm and 2000 um.

For example, the support substrate 10 may have a V-shaped groove or may have a constant interval between the support substrate 10 and the target object 200. Here, the cross section of the form having the constant interval between the support substrate 10 and the target object 200 includes, for example, a perfect circle, a partially imperfect circle, or various shapes having at least an arc such as an omega ($\Omega$) form on at least a part of its periphery. In S200, the target object 200 is disposed in a space that forms the groove of the support substrate 10.

In addition, when graphene is synthesized, the characteristics of the graphene may be determined according to the distance between the non-metal layer 100 and the surface of the target object 200. In an embodiment, if the graphene film is synthesized between the non-metal layer 100 formed on the surface of the target object 200 and the surface of the target object 200, the synthesized graphene has conductivity. The graphene film synthesized in a region where the surface of the target object 200 is not contact with the non-metal layer 100 has semi-conductivity.

Even though the non-metal layer 100 is formed on the surface of the target object 200, if carbon atoms are generated, some carbon atoms may be supplied between the non-metal layer 100 and the surface of the target object 200. Meanwhile, since the non-metal layer 100 is formed directly on the target object 200, the oxygen atoms may not be supplied therebetween, unlike the carbon atoms. Thus, the graphene synthesized between the surface of the target object 200 and the non-metal layer 100 has a crystallized structure free from defect caused by oxygen atoms. When the graphene is in the crystallized state, the valence band and the conduction band are in contact with each other, so that they substantially have a point-bandgap structure without a bandgap, and thus the graphene has conductivity like metal.

Meanwhile, unlike the graphene in the crystallized state, graphene having defect does not have a point-bandgap structure any more. It is because the point-bandgap structure is broken due to the defect. Here, if the point-bandgap structure is broken, it indicates that a bandgap is formed between the valence band and the conduction band. The defect may be generated when the efficiency of graphene synthesis is inhibited by substances other than carbon atoms or when the graphene has an abnormal hole (or mismatch) due to the lack of carbon atoms.

In addition, when the defect has a size of a nanometer unit, a quantum effect is applied to the energy band structure of the graphene crystal. The quantum effect may also be a factor to eliminate the point-bandgap structure.

In an embodiment, when the distance between the surface of the target object 200 and the non-metal layer 100 is increased, the synthesized graphene may have an incomplete crystallization structure including defect. In this embodiment, oxygen, which is not able to be supplied to a portion where the non-metal layer 100 and the target object 200 are in contact, is able to be supplied together with the carbon atoms. Thus, the graphene synthesized in this embodiment has defect caused by the oxygen.

In addition, the synthesized graphene may have defect due to the lack of carbon atoms as the distance is increased as described above. Further, the quantum effect caused by the size of the defect may give an influence on the graphene. As a result, the semi-conductivity of the graphene is proportional to the distance.

As described above, the characteristics of the graphene may be controlled by adjusting the distance between the target object 200 and the non-metal layer 100.

In some embodiments, a conductive graphene and a semi-conductive graphene may be simultaneously synthesized when the non-metal layer 100 and the surface of the target object 200 are partially in contact and partially not in contact.

In S300, the temperature (the target temperature) at which the graphene film grows may be below 1050° C.

Since S300 includes decomposing the carbon precursor 310 injected into the reactor to grow the graphene, the growth temperature of the graphene is also influenced by the type of the carbon precursor 310. Since the carbon precursor 310 may have different atoms and different atom bonds, the temperature at which highly efficient catalytic activity may be obtained differs depending on the structural and material characteristics of the carbon precursor 310.

However, considering the process efficiency and the application range of the support substrate 10, it is desirable that the graphene film is synthesized in a relatively low temperature range. Also, in the method for preparing a graphene film according to the present disclosure, a high-quality graphene film may be obtained by growing graphene at a temperature of 1050° C. or below when methane is used.

Additionally, the method may further include blocking at least a part of the ambient space of the target object 200. In the process of synthesizing a graphene film, one of important parameters is whether oxygen comes into contact with a carbon atom. Due to the difference in binding energy, the carbon (C)-oxygen (O) bond is formed more easily than the carbon (C)-carbon (C) bond. Thus, as the oxygen concentration is lower, the graphene film with higher quality is synthesized. In some embodiments, the quality of graphene may be increased by using a screen 500 that blocks a part or all of the oxygen atoms that are injected.

In addition, after the graphene film is directly synthesized on the surface of the target object 200, another graphene film may be synthesized on a surface of another target object by reusing the non-metal layer 100 formed on the support substrate 10. The non-metal layer 100 formed on the support substrate 10 maintains the gamma ($\gamma$) phase already formed in S100 by experiencing the process of synthesizing a graphene film by reuse. Thus, in the reusing process, it is not required to perform a separate treatment process for the non-metal layer 100.

In some embodiments, when the graphene is grown on the surface of the non-metal layer 100 to synthesize a graphene film, the graphene film of the non-metal layer 100 may be removed prior to reusing the non-metal layer 100 formed on the support substrate 10. The process of removing the graphene film from the non-metal layer 100 may be performed by peeling off a portion of the graphene film with a tweezers or the like.

In an embodiment, the target object 200 may include an optical fiber, or a variety of optical devices having a three-dimensional surface.

Referring to FIG. 2 again, if a target object 200 (namely, an optical fiber (a bare fiber)) where graphene is not synthesized is subjected to S100 to S300 for directly synthesizing graphene, the graphene is synthesized on the surface of the bare fiber as shown at the right side of FIG. 2.

The bare fiber 200 may be a D-shaped bare fiber 200 having a flat surface formed by removing a part of the cross-section along the length direction of a waveguide of the bare fiber. In some embodiments, the cross-section is removed by polishing, but the cross-section may be removed in a variety of ways without being limited thereto.

For example, the bare fiber 200 includes a core formed at the center thereof to allow a laser to pass therethrough, and a cladding surrounding the core and made of a material with a higher refractive index than the core. A side surface of the cladding is polished along the length direction of the bare fiber to remove a part thereof. Accordingly, when being observed at a side of the cladding aspect, a flat surface is formed with a D-shaped groove.

In an experimental example, an $Al_2O_3$ film is prepared using ALD, and then a graphene film may be produced by growing graphene on the surface of the bare fiber whose surface is partially polished.

First, an $Al_2O_3$ film is prepared using ALD. In the experimental example, the $Al_2O_3$ film is grown at a silicon (Si) V-shaped groove using an atomic layer deposition (ALD) reactor (CN1 Co., LTD, Atomic Class). As a precursor of the $Al_2O_3$ film, a high-purity nitrogen gas (99.999%) is supplied at 200 sccm for 60 seconds, with a basic pressure of 1 torr in the ALD reactor and a pulse duration of 1 second. In the above condition, 500 cycles are performed to prepare an $Al_2O_3$ film with a thickness of 50 nm. Alumina immediately after the deposition using ALD has an amorphous property, but it is crystallized to alumina with crystallinity in a heating process during the thermal treatment for the growth of graphene.

The D-shaped bare fiber is disposed in a space opposite to the gamma ($\gamma$)-$Al_2O_3$ film, so that the polished surface faces the gamma ($\gamma$)-$Al_2O_3$ film. After that, using the high-purity $CH_4$ (99.999%) as a carbon precursor, graphene is grown on the polished surface in the CVD reaction furnace to form a graphene film.

In addition, 1000 sccm argon (Ar) is injected into a quartz tube for 7 minutes for flushing. The inside of the reaction furnace may be heated to 1050° C. under the argon (Ar) atmosphere. After the temperature reaches 1050° C., $CH_4$ (400 sccm) is allowed to flow so that graphene is grown on a desired surface facing $Al_2O_3$ for a predetermined time (about 15 minutes). After the growth, the reaction furnace may be cooled while maintaining the supply of $H_2$ and $CH_4$. In the experimental example, pre-annealing and post-annealing may be excluded during the growth.

The bare fiber 200 where the graphene film is directly synthesized on the surface may be used as a variety of optical devices.

FIG. 6 is a schematic diagram showing a laser pulse device including a bare fiber where the graphene of FIG. 2 is directly synthesized to the surface according to an embodiment of the present disclosure. FIG. 6 is just an example, and the order of components through which laser passes may be changed.

Referring to FIG. 6, a laser pulse device 600 for generating a laser pulse may configure a laser resonance loop by including a light source 610, a coupler 620, 660, an amplifier 630, an isolator 640, a bare fiber 650 of FIG. 2, a polarization controller (PC) 670, and a single-mode fiber (SMF) 680.

The light source 610 is a device for outputting a continuous wave laser and may be called a laser oscillator. The solid laser for the light source 610 may employ Ruby, Nd:YAG (neodymium-doped aluminum nitride, $Nd:Y_3Al_5O_{12}$), Nd:Glass (Neodymium glass), or Ti:Sapphire. In an embodiment, the light source 610 may be a laser diode that outputs light having a wavelength of 90 nm.

The coupler 620, 660 may divide an input light into one or more lights or may merge one or more input lights into one light. In an embodiment, the coupler 660 may split light at a ratio of 90:10, and the light output from the laser resonance loop corresponds to 10%.

The amplifier 630 amplifies the laser transmitted in the laser resonance loop. The laser pulse device 600 may instantaneously obtain a large laser pulse output through the amplifier 630. In an embodiment, the amplifier 630 may be made of an Er-doped fiber (EDF). In an embodiment, the light source 610 may be used to pump an EDF 630 of 4.93 m long through a wavelength division multiplex (WDM).

The laser amplified by the amplifier 630 is supplied to the bare fiber 650 including the graphene of FIG. 2, through the isolator 640. Since the isolator 640 prevents the transmitted laser from flowing backward, the laser flows only in one direction.

The surface of the bare fiber 650 is partially polished to give a longer optical interaction length, a higher optical damage threshold, and a lower insertion loss, and may provide efficient evanescent field interaction between the graphene film and the supplied laser signal. By doing so, the laser pulse device 600 may produce ultra-fast pulses with wide spectrum, high intensity, and very short duration. The laser pulse output from the bare fiber 650 is diverged through the coupler 660 and then output. After the output, the laser pulse may be provided to various analyzers (for example, an oscilloscope, an RF spectrum analyzer, and so on). The polarization of the laser flowing in the laser resonance loop is controlled by the polarization controller 670.

In an embodiment, the laser pulse device 600 may further include a single-mode fiber 680. In the process where laser pulses move along the bare fiber connecting the components 610 to 660 of the laser pulse device 600 to each other, the refractive index of the glass that is a material of the bare fiber is changed according to the wavelength of the moving laser pulse, so the arrival time is changed, and the laser pulses are widened. This is called chromatic dispersion. The laser pulse device 600 may control the chromatic dispersion by means of the single-mode fiber (SMF) 680 and thus produce higher-quality laser pulses.

FIGS. 7A to 7D are diagrams showing characteristics of pulse generated by the laser pulse device of FIG. 6 according to an embodiment of the present disclosure.

Figure 7A:
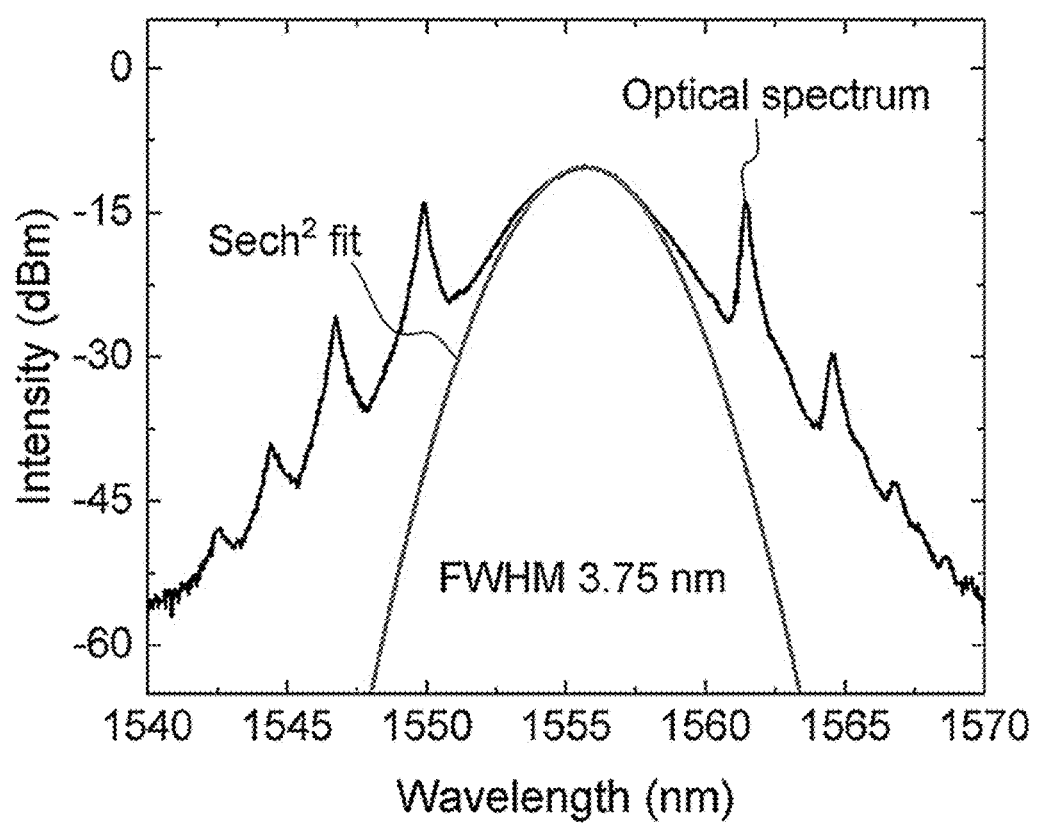

FIG. 7A is a diagram showing an optical spectrum region of a pulse generated by the laser pulse device of FIG. 6. Referring to FIG. 7A, it is possible to obtain a typical soliton-like laser pulse with a Kelly sideband peak with graphene SPF-SA from a pump LD power of 10 mW at polarized light optimized by PC. The spectrum of the laser pulse has a central wavelength at $\lambda=1555.82$ nm and has a 3 dB bandwidth of 3.75 nm.

Figure 7B:
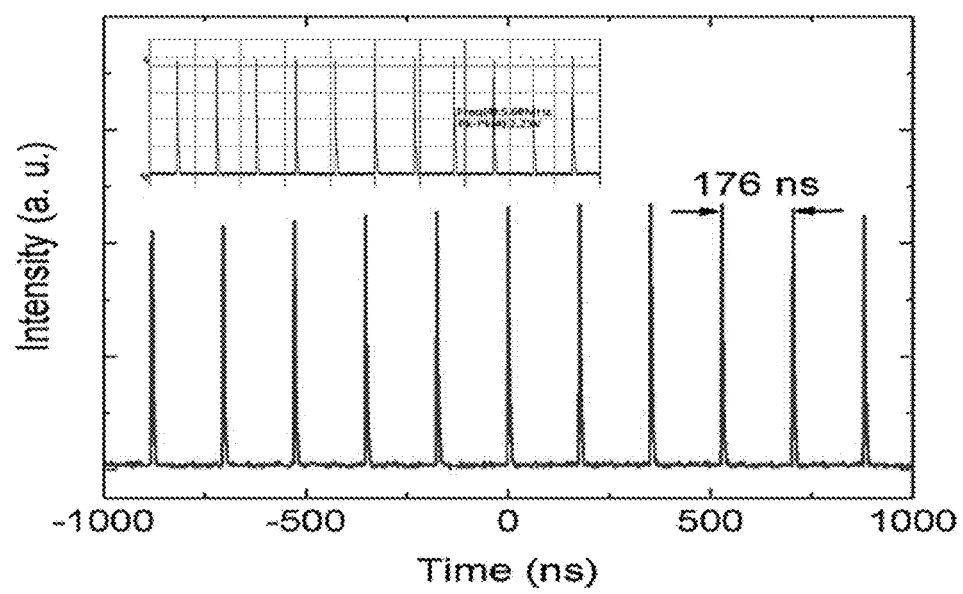

FIG. 7B is a diagram showing a measurement result of the repetition rates of the laser pulse train. Referring to FIG. 7B, by using the laser pulse device 600, it is possible to obtain a laser pulse with a repetition rate of 5.68 MHz.

Figure 7C:
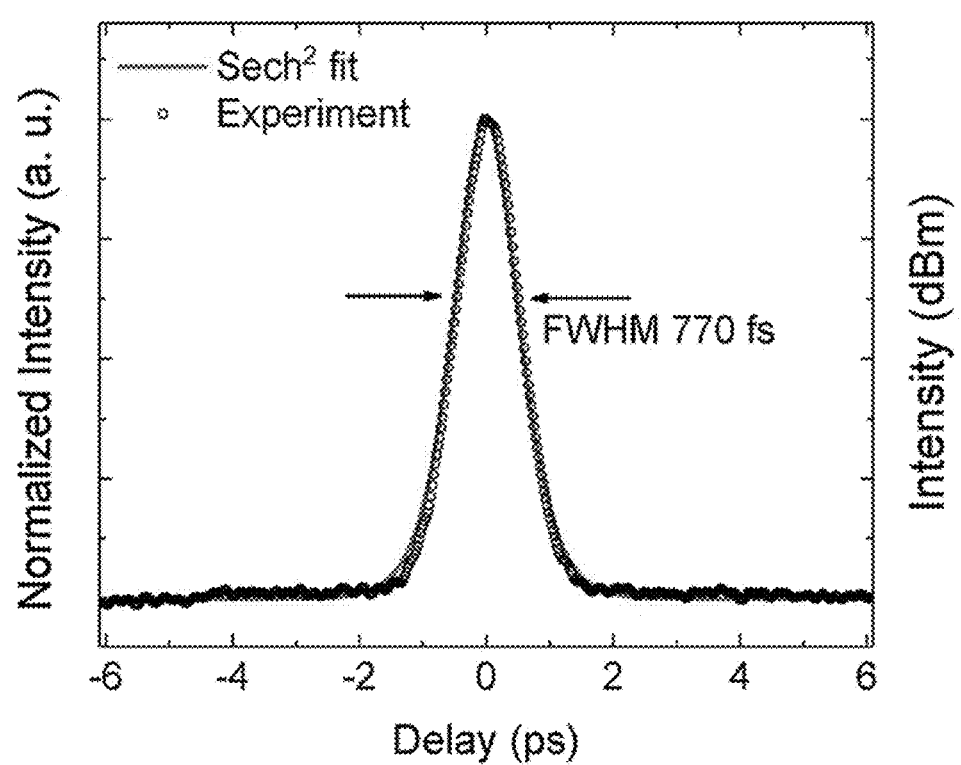

Referring to FIG. 7C, by using the laser pulse device 600, it is possible to obtain a laser pulse with a full width half maximum (FWHM) of 770 fs.

Figure 7D:
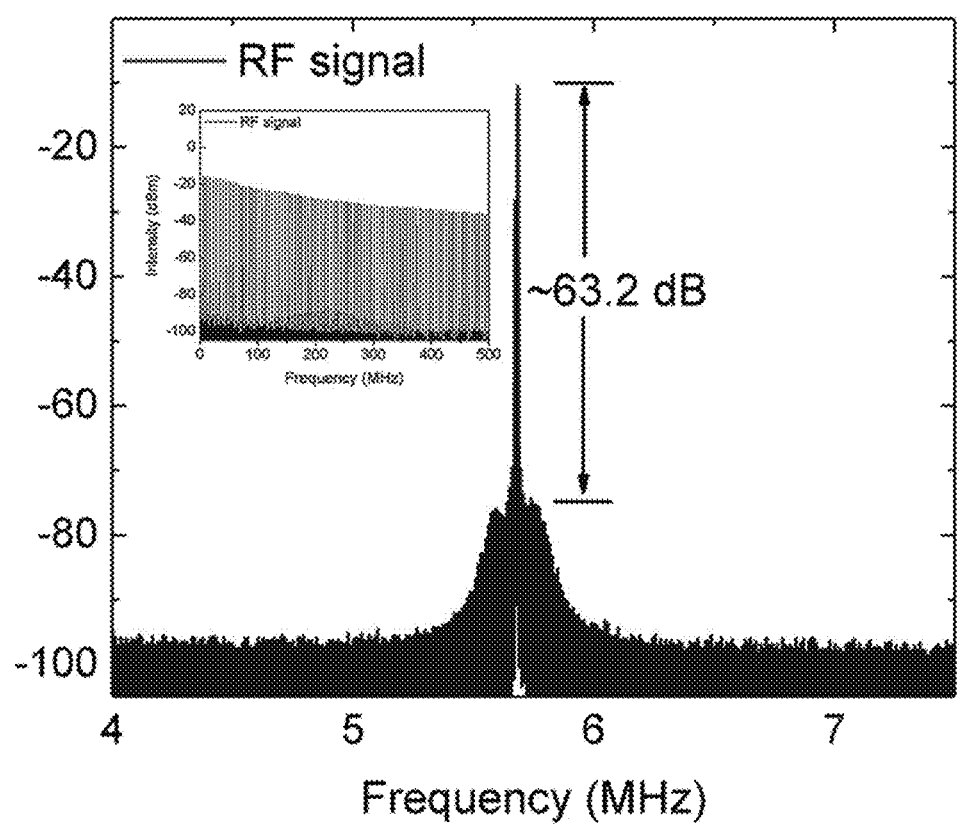

FIG. 7D is a diagram showing a measurement result of the radio-frequency (RF) of a laser pulse. Referring to FIG. 7D, by using the laser pulse device 600, it is possible to obtain a laser pulse with a peak where a signal-to-noise ratio is 63.2 dB at the repetition rate (5.68 MHz) for the bare fiber 650. Thus, if the laser pulse device 600 is used, a stable laser pulse may be obtained.

FIG. 8 is a schematic diagram showing an optical switch device including a bare fiber where the graphene of FIG. 2 is directly synthesized to the surface according to an embodiment of the present disclosure.

Referring to FIG. 8, an optical switch device 800 includes a first channel 811 and a second channel 831 for generating different continuous wave lasers, a modulator 833 for modulating the lasers, first and second wavelength tunable filters 817, 837 for reducing an ambient noise while matching a central wavelength with the laser, a coupler 850, and an optical device 870 using graphene.

The first channel 811 and the second channel 831 generate continuous wave lasers of different wavelengths. That is, the first channel 811 outputs a first laser having a continuous wave of a first wavelength, and the second channel 831 outputs a second laser having a continuous wave of a second wavelength different from the first wavelength.

For example, the first channel 811 and the second channel 831 are a continuous wave laser of a distributed feedback laser source operating at 1552.6 nm and a CW tunable laser operating at 1559 nm and serve as a pump and a signal for FWM, respectively.

The modulator 833 modulates the second laser output from the second channel 831. In one embodiment, the modulator 833 periodically turns on/off the second laser, which is a continuous wave, to be modulated into a pump signal. The signal may be modulated up to 20 GHz to ensure a very fast nonlinear response at the grown graphene.

The optical switch device 800 may further include a first amplifier 815 for amplifying the wavelength of the first laser output at the first channel 811 and a second amplifier 835 for amplifying the wavelength of the second laser output at the second channel 831 or the modulator 833. For example, the pump is amplified by an amplifier made of a regular erbium-doped bare fiber (EDA), while the modulated signal light is amplified by an amplifier made of a low-noise high-power erbium-doped bare fiber (HP-EDF).

The first wavelength tunable filter 817 is a frequency filter that changes the wavelength of the first laser. Also, the second wavelength tunable filter 837 is a frequency filter that changes the wavelength of the modulated second laser. Since the first wavelength tunable filter 817 and the second wavelength tunable filter 837 may be used to tune the wavelength, it may be controlled to have a desired frequency band by using the first wavelength tunable filter 817 and the second wavelength tunable filter 837.

The optical switch device 800 may further include a first polarization controller 819 and a second polarization controller 839 for adjusting the polarized lights of the first laser and the second laser. The coupler 850 combines the first laser and the second laser and then outputs the same.

The optical device 870 controls the combined first and second lasers output from the coupler 850 by using the nonlinearity of the graphene and the action of the evanescent field. In an embodiment, the optical device 870 is formed by synthesizing graphene on the flat surface of a D-shaped bare fiber, as illustrated in FIG. 2.

FIGS. 9A and 9B are diagrams showing spectrum results of a signal modulated at the optical switch device of FIG. 8 according to an embodiment of the present disclosure.

FIG. 9A shows the layout for obtaining an output FWM spectrum by using the optical spectrum analyzer (OSA) 890 for the laser pulse generated at the optical switch device of FIG. 8.

In order to demonstrate the effect of the four wave mixing (FWM), the pump wavelength may be tuned to 1552.6 nm and the signal wavelength may be fixed to 1559 nm. The input power of the laser coupled through the optical device 870 is measured at 22.5 dBm.

In order to more accurately measure the nonlinearity effect by the graphene film, the FWM spectrum is measured using the optical device 870 without graphene. In this case, a signal pair newly generated at 1546.2 nm and 1565.4 nm may be obtained due to the nonlinearity of the optical device 870 without graphene.

In order to measure the FWM spectrum by using the optical device 870 having graphene, the incident pump and the signal light at the spectrum generate new signals of different wavelengths through the FWM of the graphene.

Thus, the third-order nonlinearity of the graphene generates a new signal through FWM. The modulation rate of the signal light is adjusted up to 20 GHz to distinguish whether the FWM-based wavelength conversion results from the thermal effect of graphene crystal or the fast third-order nonlinearity.

Seeing the measurement result, as shown in FIG. 9B, when the laser pulse moves through the optical device 870, the sideband spectrum is gradually separated as the modulation frequency increases. This shows that the sideband is linearly separated from the main peak of the newly generated signal, and also shows that the optical device 870 having graphene prepared in FIG. 2 may successfully copy the modulation information for the newly generated signal.

Since the nonlinear effect of the graphene is an ultrafast process, the third-order nonlinear effect of the graphene becomes greater as being closer to 20 GHz. More specifically, a signal that is modulated at a modulation frequency of 20 GHz shows a sideband at a relatively identical position, compared with a lower modulation frequency. Thus, the optical switch device 800 of FIG. 8 may be used for ultrafast optical signal management. The conversion efficiency, which is defined as a ratio of the generated signal power of FIG. 8 to the original signal power, is measured as −71.1 dB.

FIGS. 10A and 10B are diagrams showing characteristics of the signal generated in FIG. 8 according to an embodiment of the present disclosure.

FIG. 10A is a diagram showing a result of comparing an extinction ratio of an optical device 870 according to presence or absence of graphene. Referring to FIG. 10A, if the optical device 870 having the graphene prepared by the method of FIG. 2 is used, it is possible to obtain a signal output that is about 1.6 dB higher and about 33% stronger.

Additionally, the nonlinearity of the optical device 870 having the graphene prepared by the method of FIG. 2 may be confirmed again using three different types of samples. FIG. 10B is a diagram showing a plot of an extinction ratio (ER) and separation of the first and second sidebands of an original signal and a signal generated as a function of the modulated signal. The separation of the first and second sidebands increases linearly along with the modulation frequency, which is the same as the original signal, as shown in the graph. The similar nonlinearity may be obtained in all three different types of samples, and thus it is possible to confirm again the quality of the graphene prepared by the method of FIG. 2.

FIG. 11 is a diagram showing a conceptual structure of a graphene thin film transistor according to an embodiment of the present disclosure. In an embodiment, the target object 200 may include an electronic device (or, a component of an electronic device) without being limited to an optical device. For example, the target object 200 may be a dielectric layer of a thin film transistor (TFT) as shown in FIG. 11.

The thin film transistor may include a non-metal layer, a dielectric layer to which graphene is to be applied, a gate electrode located at a side opposite to the dielectric layer, a first graphene film having the conductive graphene, and a second graphene film having the semi-conductive graphene.

The dielectric layer of the thin film transistor is located at least partially not in contact with the non-metal layer. The semi-conductivity characteristic of the graphene is proportional to the distance between the surface of the non-metal layer and the surface of the target object. Based on this, it is possible to design so that the graphene partially has conductivity and partially has semi-conductivity. Thus, it is possible to synthesize graphene films having different characteristics. The graphene film with conductivity may function as an electrode of the thin film transistor, and the graphene film with semi-conductivity may function as a channel of the thin film transistor.

If the distance between the surface of the non-metal layer and the surface of the target object is set differently as above, it is possible to manufacture a thin film transistor by partially controlling the conductivity and semi-conductivity of the graphene. In particular, if the method of FIG. 3 is used, semi-conductive graphene and conductive graphene may be prepared simultaneously by one process, thereby making it possible to manufacture a thin film transistor more efficiently.

If the method of FIG. 2 is used as above, the high-quality graphene film having high quality nonlinear characteristics as shown in FIGS. 7 and 9 to 11 may be directly synthesized on the surface of the target object 200.

Although the present disclosure has been described with reference to the embodiments shown in the drawings, it should be understood that various changes and modifications can be made thereto by those skilled in the art without departing from the scope of the present invention. However, such modifications should be considered to fall within the technical protection of the present disclosure. Accordingly, the true scope of the present disclosure should be determined by the technical idea of the appended claims.

In the method of for directly synthesizing graphene on a surface of a target object according to an embodiment of the present disclosure, since the graphene film is synthesized through a transfer-free and metal-free process, there is no degradation of graphene quality (e.g., additional defects, wrinkles, tears, and the like) after synthesis, which may occur in the graphene film during the transferring and etching processes, so it is possible to provide a high-quality graphene giving excellent optical characteristics.

In particular, since the surface of the target object is not limited to a simple two-dimensional plane, it is possible to synthesize a graphene film even on a stereoscopic surface with a three-dimensional structure. Thus, the graphene film may be directly synthesized on future integrated device that may have increasingly complex structures and have various surface structures according to the designer's intent.

Thus, since users are able to design electronic and optical devices more freely, it is expected that the present disclosure may be inexhaustibly utilized for optical electronic systems.

What is claimed is:

1. A method for directly synthesizing graphene on a surface of a target object, comprising:
    forming a non-metal layer on a support substrate;
    disposing the target object in a space above the support substrate; and
    injecting a carbon precursor to form graphene on the surface of the target object to synthesize a graphene film,
    wherein the graphene is nucleated and grown on the surface of the target object by a decomposition of the carbon precursor, the carbon precursor is decomposed by heat with catalytic assistance from the non-metal layer to diffuse a carbon atom into the space above the support substrate, and the carbon atom from the decomposition of the precursor is anchored on the surface of the target object to form the graphene film,
    wherein the target object is located within the space above the support substrate comprising the diffused carbon atom.

2. The method according to claim 1,
    wherein the carbon atom is supplied to surface of the target object by means of dissociative adsorption to nucleate and grow the graphene, an energy of metastable atom of the non-metallic catalytic layer is supplied to the carbon precursor for the decomposition of the carbon precursor to generate the carbon atom.

3. The method according to claim 1,
    wherein at least a part of the surface of the target object has a three-dimensional shape.

4. The method according to claim 1,
    wherein the disposing the target object includes that the non-metal layer and the target object are at least partially not in contact with each other.

5. The method according to claim 4,
    wherein a non-contact interval between the target object and the non-metal layer is 1 nm to 2000 um.

6. The method according to claim 1,
    wherein the support substrate has a groove having a V-shaped form or has a constant interval between the support substrate and the target object.

7. The method according to claim 1, further comprising:
    installing a screen to block at least a part of an ambient space of the target object.

8. The method according to claim 1,
    wherein the non-metal layer is made of gamma (γ) alumina.

9. The method according to claim 1,
    wherein the forming a non-metal layer includes forming an amorphous non-metal layer by using atomic layer deposition (ALD).

10. The method according to claim 9,
    wherein the forming a non-metal layer further includes crystallizing the amorphous non-metal layer.

11. The method according to claim 10,
    wherein the precursor for forming the non-metal layer includes any one aluminum precursor selected from the group consisting of trimethyl aluminum (($CH_3)_3Al$, TMA), aluminum isopropoxide ([$Al(OC_3H_7)_3$], IPA), methyl pyrrolidine-tri-methyl aluminum (MPTMA), ethyl-pyridine-triethyl-aluminum (EPPTEA), ethyl-pyridine-dimethyl-aluminum hydride (EPPDMAH), trimethyl aluminum ($AlCH_3$), and combinations thereof.

12. The method according to claim 1, further comprising:
synthesizing another graphene on a surface of another target object by reusing the non-metal layer formed on the support substrate.

13. The method according to claim 1,
wherein the carbon precursor includes any one selected from the group consisting of methane, ethane, propane, acetylene, methanol, ethanol, propanol, and combinations thereof.

14. The method according to claim 1,
wherein the reaction gas includes any one selected from the group consisting of nitrogen, helium, neon, argon, hydrogen, and combinations thereof.

15. The method according to claim 1,
wherein the target object is an optical fiber, and a surface of the optical fiber is at least partially removed.

16. The method according to claim 4,
wherein when the graphene is synthesized, conductivity or semi-conductivity is determined according to a distance between the non-metal layer and the target object surface, and
wherein a conductive graphene is synthesized when the non-metal layer is formed in contact with the surface of the target object, and a semi-conductive graphene is synthesized when the non-metal layer is formed not in contact with the surface of the target object.

17. The method according to claim 1, wherein the target object is opposite to the non-metal layer.

\* \* \* \* \*